United States Patent
Matsuba et al.

(10) Patent No.: US 9,329,477 B2
(45) Date of Patent: May 3, 2016

(54) PHOTOSENSITIVE CONDUCTIVE PASTE

(71) Applicant: Toray Industries, Inc., Tokyo (JP)

(72) Inventors: Satoshi Matsuba, Nagoya (JP); Tsukuru Mizuguchi, Otsu (JP); Kazutaka Kusano, Otsu (JP)

(73) Assignee: Toray Industries, Inc. (JP)

( * ) Notice: Subject to any disclaimer, the term of this patent is extended or adjusted under 35 U.S.C. 154(b) by 0 days.

(21) Appl. No.: 14/374,407

(22) PCT Filed: Jan. 24, 2013

(86) PCT No.: PCT/JP2013/051406
§ 371 (c)(1),
(2) Date: Jul. 24, 2014

(87) PCT Pub. No.: WO2013/111805
PCT Pub. Date: Aug. 1, 2013

(65) Prior Publication Data
US 2015/0044610 A1    Feb. 12, 2015

(30) Foreign Application Priority Data

Jan. 26, 2012 (JP) .................................. 2012-013829
Mar. 28, 2012 (JP) .................................. 2012-073337

(51) Int. Cl.
| | | |
|---|---|---|
| G03F 7/038 | (2006.01) | |
| G03F 7/30 | (2006.01) | |
| G03F 7/40 | (2006.01) | |
| H01L 21/027 | (2006.01) | |
| H05K 3/12 | (2006.01) | |
| H01B 1/20 | (2006.01) | |
| G03F 7/004 | (2006.01) | |
| H01B 1/22 | (2006.01) | |
| C09D 5/24 | (2006.01) | |
| H05K 1/09 | (2006.01) | |
| G03F 7/16 | (2006.01) | |
| H05K 3/02 | (2006.01) | |

(52) U.S. Cl.
CPC .... G03F 7/038 (2013.01); C09D 5/24 (2013.01); G03F 7/004 (2013.01); G03F 7/0047 (2013.01); G03F 7/168 (2013.01); H01B 1/22 (2013.01); H05K 1/095 (2013.01); H05K 3/02 (2013.01); H05K 2203/0514 (2013.01)

(58) Field of Classification Search
None
See application file for complete search history.

(56) References Cited

U.S. PATENT DOCUMENTS

| | | | | |
|---|---|---|---|---|
| 4,908,296 | A * | 3/1990 | Nebe et al. | 430/281.1 |
| 6,451,878 | B1 * | 9/2002 | Fukuzawa et al. | 523/451 |
| 2007/0185287 | A1 * | 8/2007 | Itagaki et al. | 525/524 |
| 2008/0124525 | A1 * | 5/2008 | Ushiki et al. | 428/195.1 |
| 2011/0129778 | A1 | 6/2011 | Murata et al. | |
| 2011/0177302 | A1 | 7/2011 | Takita | |

FOREIGN PATENT DOCUMENTS

| | | |
|---|---|---|
| EP | 1 213 327 | 6/2002 |
| JP | 01-253111 | 10/1989 |
| JP | 08-315885 | 11/1996 |
| JP | 2003-162921 | 6/2003 |
| JP | 2003-301018 | 10/2003 |
| JP | 2005-267859 | 9/2005 |
| JP | 2007-153749 | 6/2007 |
| JP | 4034555 | 1/2008 |
| JP | 2008-122546 | 5/2008 |
| JP | 2011-064864 | 3/2011 |
| JP | 2011-132215 | 7/2011 |

OTHER PUBLICATIONS

English translation of JP 2005-267859, A (2005) from machine translation from AIPN Japan Patent Office National Center for Industrial Property Information and Training, generated Jun. 28, 2015, 16 pages.*
English translation of JP 2003-301018, A (2003) from machine translation from AIPN Japan Patent Office National Center for Industrial Property Information and Training, generated Jun. 28, 2015, 8 pages.*
English translation of JP 2003-162921, A (2003) from machine translation from AIPN Japan Patent Office National Center for Industrial Property Information and Training, generated Jun. 28, 2015, 7 pages.*
English translation of JP 2011-064864, A (2011) from machine translation from AIPN Japan Patent Office National Center for Industrial Property Information and Training, generated Jun. 28, 2015, 15 pages.*
English translation of JP 08-315885, A (1996) from machine translation from AIPN Japan Patent Office National Center for Industrial Property Information and Training, generated Jun. 28, 2015, 5 pages.*
Corresponding Office Action of Chinese Application No. 201380006713.2 dated Dec. 17, 2014 with English translation.

* cited by examiner

Primary Examiner — Cynthia Hamilton
(74) Attorney, Agent, or Firm — DLA Piper LLP (US)

(57) ABSTRACT

A photosensitive conductive paste provides a coating film having good storage stability, is capable of maintaining high adhesion under relatively low temperature curing conditions, and is also capable of exhibiting high conductivity. The photosensitive conductive paste contains (A) conductive particles, (B) a photosensitie component, (C) a photopolymerization initiator and (D) an epoxy resin, wherein the epoxy resin (D) has an epoxy equivalent weight of 200-500 g/equivalent.

4 Claims, 1 Drawing Sheet

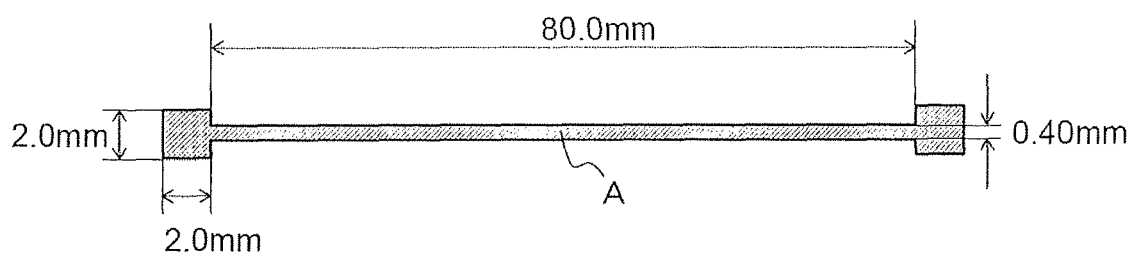

– 1 –

PHOTOSENSITIVE CONDUCTIVE PASTE

TECHNICAL FIELD

This disclosure relates to a photosensitive conductive paste to form conductive patterns.

BACKGROUND

The "conductive pattern" referred to herein relates to a conductive pattern that contains both an organic component including a resin and an inorganic component including a conductive filler etc.

So-called "polymer-type conductive paste" with a large amount of a particulate silver flake or copper powder, or carbon particles mixed in a resin or an adhesive to form an organic-inorganic composite conductive pattern as described above has come into practical use. Generally, the method of forming a conductive pattern is classified into a method using screen printing (see, for example, Japanese Patent Laid-open Publication No. 1-253111 and Japanese Patent Laid-open Publication No. 2005-267859) and a method using a photocurable photosensitive conductive curable paste (see, for example, Japanese Patent Laid-open Publication No. 2003-162921), but use of a photocurable photosensitive conductive curable paste capable of accurately drawing a pattern of 50 μm or less and capable of being cured at a low temperature is becoming mainstream in response to the recent trend of line thinning and temperature lowering.

When the photocurable photosensitive conductive paste is used, a pattern of about several tens μm can be formed, adhesion with a film and a glass substrate tends to be deteriorated as the line width decreases. Mention is made of a method in which an epoxy resin is added for improving adhesion (see, for example, Japanese Patent No. 4034555 and Japanese Patent Laid-open Publication No. 2003-301018). However, depending on a type of epoxy resin, a paste coating film has poor storage stability so that the shape of the conductive pattern obtained is affected by a time period until exposure, or there is no effect on adhesion with a base material such as a resin film or glass.

When the amount of an epoxy resin is increased, initial adhesion is improved, but peeling easily occurs after a wet heat test. Further, when the amount of an epoxy resin is increased, resistance increases.

It could therefore be helpful to provide a photosensitive conductive paste that ensures good storage stability of a paste coating film, is capable of maintaining high adhesion under relatively low temperature curing conditions, and is capable of exhibiting high conductivity. It could also be helpful to provide a photosensitive conductive paste which has good adhesion after a wet heat test.

SUMMARY

We thus provide a photosensitive conductive paste including: conductive particles (A); a photosensitive component (B); a photopolymerization initiator (C); and an epoxy resin (D), wherein the epoxy equivalent weight of the epoxy resin (D) is in a range of 200 to 500 g/equivalent, i.e. a photosensitive conductive paste including: conductive particles (A); a photosensitive component (B); a photopolymerization initiator; and an epoxy resin (D), wherein the epoxy resin (D) has an epoxy equivalent weight of 200 to 500 g/equivalent.

We also provide a photosensitive conductive paste including: conductive particles (A); a photosensitive component (B); a photopolymerization initiator; an epoxy resin (D); and a compound (E) having 1 to 3 hydroxyl groups and 10 to 18 carbon atoms.

An advantage is obtained that a paste coating film has good storage stability, a conductive pattern having high adhesion and conductivity is obtained under low temperature curing conditions, and fine patterning is possible due to high photosensitive characteristics. The advantage of good adhesion after a wet heat test is thus obtained.

BRIEF DESCRIPTION OF THE DRAWINGS

FIG. 1 is a schematic view showing a light transmission pattern of a photomask used in evaluation of the specific resistivity in examples.

DESCRIPTION OF REFERENCE SIGNS

A Light transmission part

DETAILED DESCRIPTION

The photosensitive conductive paste is a photosensitive conductive paste including: conductive particles (A); a photosensitive component (B); a photopolymerization initiator (C); and an epoxy resin (D), wherein the epoxy resin (D) has an epoxy equivalent weight of 200 to 500 g/equivalent.

The paste is applied onto a substrate, dried to remove a solvent as necessary, and then subjected to exposure, development and a curing step at 100 to 300° C., whereby a desired conductive pattern can be obtained on the substrate. The conductive pattern obtained using the paste is a composite of an organic component and an inorganic component, and conductive particles come into contact with one another due to setting shrinkage during curing to exhibit conductivity.

The conductive particles (A) contained in the photosensitive conductive paste preferably include at least one of Ag, Au, Cu, Pt, Pb, Sn, Ni, Al, W, Mo, ruthenium oxide, Cr, Ti and indium, and these conductive particles can be used alone, or as an alloy or a mixed powder. Conductive particles obtained by coating insulating particles or conductive particles with the above-mentioned component can be similarly used. Particularly, Ag, Cu and Au are preferred from the viewpoint of conductivity, and Ag is preferred from the viewpoint of costs and stability.

The volume average particle size of the conductive particles (A) is preferably 0.1 to 10 μm, more preferably 0.3 to 3 μm. When the volume average particle size is 0.1 μm or more, the probability of contact between conductive particles is improved, the specific resistivity and breakage probability of the conductive pattern prepared can be reduced, and ultraviolet rays during exposure can be smoothly transmitted through the film so that fine patterning becomes easy. When the volume average particle size is 10 μm or less, surface smoothness, pattern accuracy and dimensional accuracy of a circuit pattern after printing are improved. The volume average particle size can be determined by the Coulter counter method.

The added amount of the conductive particles (A) is in a range of preferably 70 to 95% by weight, more preferably 80 to 90% by weight based on the total solid content in the photosensitive conductive paste. When the added amount of the conductive particles (A) is 80% by weight or more, the probability of contact between conductive particles particularly in setting shrinkage during curing is improved, the specific resistivity and breakage probability of the conductive pattern prepared can be reduced. When the added amount of the conductive particles (A) is 90% by weight or less, ultraviolet rays particularly during exposure can be smoothly transmitted through the film so that fine patterning becomes easy. The solid content is a content after removing a solvent from the photosensitive conductive paste.

The photosensitive component (B) contained in the photosensitive conductive paste is preferably a monomer, oligomer or polymer having at least one unsaturated double bond in the molecule, and one or more kinds thereof can be used.

Specific examples of the photosensitive component (B) include acryl-based copolymers. The acryl-based copolymer is a copolymer containing at least an acryl-based monomer as a copolymerization component, and specific examples of the preferred acryl-based monomer include acryl-based monomers such as methyl acrylate, acrylic acid, 2-ethylhexyl acrylate, ethyl methacrylate, n-butyl acrylate, i-butyl acrylate, i-propane acrylate, glycidyl acrylate, N-methoxymethylacrylamide, N-ethoxymethylacrylamide, N-n-butoxymethylacrylamide, N-isobutoxymethylacrylamide, butoxytriethylene glycol acrylate, dicyclopentanyl acrylate, dicyclopentenyl acrylate, 2-hydroxyethyl acrylate, isobonyl acrylate, 2-hydroxypropyl acrylate, isodecyl acrylate, isooctyl acrylate, lauryl acrylate, 2-methoxyethyl acrylate, methoxyethylene glycol acrylate, methoxydiethylene glycol acrylate, octafluoropentyl acrylate, phenoxyethyl acrylate, stearyl acrylate, trifluoroethyl acrylate, acrylamide, aminoethyl acrylate, phenyl acrylate, phenoxyethyl acrylate, 1-naphthyl acrylate, 2-naphthyl acrylate, thiophenol acrylate and benzylmercaptan acrylate, and those with acrylate of the above-mentioned monomers replaced by methacrylate, styrenes such as styrene, p-methylstyrene, o-methylstyrene, m-methylstyrene, α-methylstyrene, chloromethylstyrene and hydroxymethylstyrene, γ-methacryloxypropyl trimethoxysilane, 1-vinyl-2-pyrrolidone, allylated cyclohexyl diacrylate, 1,4-butanediol diacrylate, 1,3-butyrene glycol diacrylate, ethylene glycol diacrylate, diethylene glycol diacrylate, triethylene glycol diacrylate, polyethylene glycol diacrylate, dipentaerythritol hexaacrylate, dipentaerythritol monohydroxypentaacrylate, ditrimethylolpropane tetraacrylate, glycerol diacrylate, methoxylated cyclohexyl diacrylate, neopentyl glycol diacrylate, propylene glycol diacrylate, polypropylene glycol diacrylate, triglycerol diacrylate, trimethylolpropane triacrylate, and epoxy acrylates such as bisphenol A diacrylate, bisphenol F diacrylate, diacrylates of bisphenol A-ethylene oxide adducts, diacrylates of bisphenol F-ethylene oxide adducts and diacrylates of bisphenol A-propylene oxide adducts, or compounds with acryl groups of the above-mentioned compounds partially or wholly replaced by methacryl groups although all compounds having a carbon-carbon double bond can be used.

When development is performed using an alkali developer, alkali solubility can be imparted to an acryl-based copolymer by using as a monomer an unsaturated acid such as an unsaturated carboxylic acid. Specific examples of the unsaturated acid include acrylic acid, methacrylic acid, itaconic acid, crotonic acid, maleic acid, fumaric acid and vinyl acetate or acid anhydrides thereof. By adding the above-mentioned unsaturated acid to the molecular chain, the acid value of the polymer can be adjusted.

An alkali-soluble polymer having a reactive unsaturated double bond on the side chain can be prepared, the alkali-soluble polymer being obtained by reacting a part of an unsaturated acid in an acryl polymer obtained using as a monomer an unsaturated acid such as the above-mentioned unsaturated carboxylic acid with a compound having both a group reactive with an unsaturated acid and a group having an unsaturated double bond, such as glycidyl (meth)acrylate.

The acid value of the photosensitive component (B) contained in the photosensitive conductive paste is preferably 30 to 250 mg KOH/g, more preferably 40 to 200 mg KOH/g from the viewpoint of alkali solubility. When the acid value is 30 mg KOH/g or more, solubility of a soluble part in a developer is not reduced, and when the acid value is 250 mg KOH/g or less, the development allowance range can be broadened. The acid value is determined in accordance with JIS-K0070 (1992).

The glass transition temperature of the photosensitive component (B) contained in the photosensitive conductive paste is more preferably −10 to 120° C. When Tg is −10° C. or higher, tackiness of the dry film can be suppressed, and when Tg is 120° C. or lower, flexibility is exhibited at room temperature, so that internal stress at the time of bending can be relaxed, and particularly generation of cracks can be suppressed.

The glass transition temperature of the photosensitive component (B) contained in the photosensitive conductive paste can be calculated from the following equation (1) using copolymerization ratios of monomers as copolymerization components and glass transition temperatures of homopolymers of the monomers, and the obtained value is used in the paste.

$$\frac{1}{Tg} = \frac{W1}{T1} + \frac{W2}{T2} + \frac{W3}{T3} + \ldots \quad (1)$$

wherein Tg is a glass transition temperature (unit: K) of a polymer, T1, T2, T3 . . . are glass transition temperatures (unit: k) of homopolymers of monomer 1, monomer 2, monomer 3 . . . , respectively, and W1, W2, W3 . . . are copolymerization ratios of monomer 1, monomer 2 and monomer 3 . . . , respectively.

The photopolymerization initiator (C) contained in the photosensitive conductive paste refers to a compound decomposed by absorbing light having a short wavelength such as an ultraviolet ray, to generate a radical, or a compound which undergoes a hydrogen extraction reaction to generate a radical. Specific examples include, but are not particularly limited to, 1,2-octanedione, 1-[4-(phenylthio)-2-(O-benzoyloxime)], 2,4,6-trimethylbenzoyl-diphenyl-phosphine oxide, bis(2,4,6-trimethylbenzoyl)-phenyl-phosphine oxide, ethanone, 1-[9-ethyl-6-2(2-methylbenzoyl)-9H-carbazole-3-yl]-1-(O-acetyloxime), benzophenone, methyl o-benzoylbenzoate, 4,4'-bis(dimethylamino)benzophenone, 4,4'-bis(diethylamino)benzophenone, 4,4'-dichlorobenzophenone, 4-benzoyl-4'-methyldiphenylketone, dibenzylketone, fluorenone, 2,2'-diethoxyacetophenone, 2,2-dimethoxy-2-phenylacetophenone, 2-hydroxy-2-methylpropiophenone, p-t-butyldichloroacetophenone, thioxanthone, 2-methylthioxanthone, 2-chlorothioxanthone, 2-isopropylthioxanthone, diethylthioxanthone, benzyl, benzyl dimethyl ketal, benzyl-β-methoxyethyl acetal, benzoin, benzoin methyl ether, benzoin butyl ether, anthraquinone, 2-t-butylanthraquinone, 2-amylanthraquinone, β-chloroanthraquinone, anthrone, benzanthrone, dibenzosuberone, methylene anthrone, 4-azidebenzalacetophenone, 2,6-bis(p-azidebenzylidene)cyclohexanone, 6-bis(p-azidebenzylidene)-4-methylcyclohexanone, 1-phenyl-1,2-butanedione-2-(o-methoxycarbonyl)oxime, 1-phenyl-propanedione-2-(o-ethoxycarbonyl)oxime, 1-phenyl-propanedione-2-(o-benzoyl)oxime, 1,3-diphenyl-propanetrione-2-(o-ethoxycarbonyl)oxime, 1-phenyl-3-ethoxy-propanetrione-2-(o-benzoyl)oxime, Michler's ketone, 2-methyl[4-(methylthio)phenyl]-2-morpholino-1-propanone, naphthalenesulfonyl chloride, quinolinesulfonyl chloride, N-phenylthioacridone, 4,4'-azobisisobutyronitrile, diphenyl disulfide, benzothiazole disupfide, triphenylphosphine, camphor quinone, 2,4-diethylthioxanthone, isopropylthioxanthone, carbon tetrabromide, tribromophenylsulfone, benzoyl peroxide, and combinations of photo-reductive pigments such as eosin and methylene blue and reducing agents such as ascorbic acid and triethanolamine.

The added amount of the photopolymerization initiator (C) is in a range of preferably 0.05 to 30 parts by weight, more preferably 5 to 20 parts by weight based on 100 parts by weight of the photosensitive component (B). When the added amount of the photopolymerization initiator (C) is 5 parts by weight or more based on 100 parts by weight of the photosensitive component (B), the curing density of an exposed part in particular increases so that the residual film ratio after development can be enhanced. When the added amount of the photopolymerization initiator (C) is 20 parts by weight or less based on 100 parts by weight of the photosensitive component (B), excessive absorption of light particularly by the photopolymerization initiator (C) at the upper part of a coating film can be suppressed to inhibit the conductive pattern from being reversely tapered to reduce adhesion with a base material.

To the photosensitive conductive paste can be added a sensitizer along with the photopolymerization initiator (C) to improve the sensitivity and expand the range of wavelengths effective for reaction.

Specific examples of the sensitizer include 2,4-diethylthioxanthone, isopropylthioxanthone, 2,3-bis(4-diethylaminobenzal)cyclopentanone, 2,6-bis(4-dimethylaminobenzal)cyclohexanone, 2,6-bis(4-dimethylaminobenzal)-4-methylcyclohexanone, Michler's ketone, 4,4-bis(diethylamino)benzophenone, 4,4-bis(dimethylamino)chalcone, 4,4-bis(diethylamino)chalcone, p-dimethylaminocinnamylideneindanone, p-dimethylaminobenzylideneindanone, 2-(p-dimethylaminophenylvinylene)isonaphthothiazole, 1,3-bis(4-dimethylaminophenylvinylene)isonaphthothiazole, 1,3-bis(4-dimethylaminobenzal)acetone, 1,3-carbonylbis(4-diethylaminobenzal)acetone, 3,3-carbonylbis(7-diethylaminocoumarin), N-phenyl-N-ethylethanolamine, N-phenylethanolamine, N-tolyldiethanolamine, isoamyl dimethylaminobenzoate, isoamyl diethylaminobenzoate, 3-phenyl-5-benzoylthiotetrazole and 1-phenyl-5-ethoxycarbonylthiotetrazole. One or more of these compounds can be used. When the sensitizer is added to the photosensitive conductive paste, the added amount thereof is normally preferably 0.05 to 10 parts by weight, more preferably 0.1 to 10 parts by weight based on 100 parts by weight of the photosensitive component (B). When the added amount of the sensitizer is 0.1 part by weight or more based on 100 parts by weight of the photosensitive component (B), an effect of improving the light sensitivity is easily exhibited sufficiently, and when the added amount is 10 parts by weight or less based on 100 parts by weight of the photosensitive component (B), a situation can be inhibited in which light is excessively absorbed particularly at the upper part of a coating film so that the conductive pattern is reversely tapered to reduce adhesion with a base material.

It is necessary that the photosensitive conductive paste contain the epoxy resin (D), and the epoxy equivalent weight of the epoxy resin (D) be in a range of 200 to 500 g/equivalent. When the epoxy equivalent weight is 200 g/equivalent or more, a photosensitive conductive paste which ensures high storage stability of a coating film can be obtained. On the other hand, when the epoxy equivalent weight is less than 500 g/equivalent, a conductive pattern having high adhesion with various kinds of substrates such as resin films and glass substrates can be obtained. The epoxy equivalent weight refers to a weight of a resin containing 1 equivalent of epoxy groups, and can be determined by dividing a molecular weight, which is determined from a structural formula, by the number of epoxy groups included in the structure.

The added amount of the epoxy resin (D) is normally preferably 1 to 100 parts by weight, more preferably 30 to 80 parts by weight, further preferably 10 to 80 parts by weight based on 100 parts by weight of the photosensitive component (B). When the added amount is 30 part by weight or more based on 100 parts by weight of the photosensitive component (B), an effect of improving adhesion is easily exhibited sufficiently, and when the added amount is 80 parts by weight or less based on 100 parts by weight of the photosensitive component (B), a photosensitive conductive paste which ensured storage stability of a coating film can be obtained.

Preferably, the photosensitive conductive paste further includes a compound (E) having 1 to 3 hydroxyl groups and 10 to 18 carbon atoms. Particularly, when the added amount of the epoxy resin (D) is less than 30 parts by weight based on 100 parts by weight of the photosensitive component (B), adhesion is slightly deteriorated, and addition of the compound (E) having 1 to 3 hydroxyl groups and 10 to 18 carbon atoms is preferred because adhesion is improved. By reacting the compound (E) with epoxy groups of the epoxy resin (D), which have no involvement in adhesion, a situation in which unreacted epoxy groups react with water in a wet heat test to generate hydroxyl groups, water is accordingly absorbed, and swelling occurs to cause film peeling can be inhibited. Hence, adhesion can be maintained after the wet heat test. The excessive compound (E) also reacts with an oxide film on the surfaces of the conductive particles (A), and as a result of the reduction action, the specific resistivity of the conductive pattern obtained can be further reduced.

The structure of the epoxy resin (D) is not particularly limited as long as the epoxy equivalent weight is 200 to 500 g/equivalent. Specific examples include ethylene glycol-modified epoxy resins, bisphenol A-type epoxy resins, brominated epoxy resins, bisphenol F-type epoxy resins, novolak-type epoxy resins, cycloaliphatic epoxy resins, glycidyl amine-type epoxy resins, glycidyl ether-type epoxy resins and heterocyclic epoxy resins.

Examples of the type of the compound (E) having 1 to 3 hydroxyl groups and 10 to 18 carbon atoms include monohydric alcohols, polyhydric alcohols and glycol ethers having 10 to 18 carbon atoms, and examples of the structure of the compound (E) include, but are not limited to, linear saturated alkyl groups, branched saturated alkyl groups, and alkyl groups having an unsaturated double bond in the molecule.

As the monohydric alcohol having 10 to 18 carbon atoms, examples of the monohydric alcohol having a linear saturated alkyl group include 1-decanol, 2-decanol, 1-undecanol, 1-dodecanol, 2-dodecanol, 1-tridecanol, 1-tetradecanol, 2-tetradecanol, 1-pentadecanol, 1-hexadecanol, 2-hexadecanol, 1-heptadecanol, 1-octadecanol, 1-nonadecanol and 1-eicosanol.

Examples of the monohydric alcohol having a branched saturated alkyl group include 3,7-dimethyl-1-octanol, 3,7-dimethyl-3-octanol, 2-heptylundecanol, isomyristyl alcohol, isocetyl alcohol and isostearyl alcohol. Cyclic alcohols such as dicyclohexylmethanol, tricyclodecanemonomethylol, hydrogenated rosin alcohol and dihydroterpineol are also used.

The monohydric alcohol having an alkyl group having an unsaturated double bond in the molecule is a monohydric alcohol having an alkene group having one unsaturated double bond, an alkadiene group having two unsaturated double bonds, an alkatriene group having three unsaturated double bonds, or an alkapolyene group having four or more unsaturated double bonds, and examples thereof include linear, branched or cyclic unsaturated alkyl group-containing monohydric alcohols such as oleyl alcohol, linolyl alcohol, 11-hexadecene-1-ol, 7-tetradecene-1-ol, 9-tetradecene-1-ol, 11-tetradecene-1-ol, 7-dodecene-1-ol, 10-undecene-1-ol, 9-decene-1-ol, citronellol, dodecadiene-1-ol, phytol, geraniol, rhodinol, linalool, terpineol C, α-terpineol and L-α-terpineol. These monohydric alcohols can be used alone or in combination of two or more thereof in any quantitative ratio.

Examples of the polyhydric alcohol having 10 to 18 carbon atoms include alkylene dihydric alcohols such as 1,2-decanediol, 1,10-decanediol, 1,2-decanediol, 1,12-dodecanediol, 1,2-dodecanediol, 1,14-tetradecanediol, 1,2-tetradecanediol, 1,16-hexadecanediol, 1,2-hexadecanediol, polyethylene glycol and polypropylene glycol, and polyhydric alcohols such as trimethyloloctane, dipentaerythritol and tripentaerythritol cellulose.

As the glycol ether having 10 to 18 carbon atoms, examples of the glycol ether having 10 to 18 carbon atoms include glycol ether-based solvents such as dipropylene glycol n-butyl ether, triethylene glycol mono-n-butyl ether, tripropylene glycol methyl ether, tripropylene glycol ethyl ether, tripropylene glycol propyl ether and tripropylene glycol butyl ether.

The compound (E) contained in the photosensitive conductive paste is preferably a monohydric alcohol or polyhydric alcohol having 10 to 18 carbon atoms, more preferably a monohydric alcohol. The monohydric alcohol has lower reactivity and, therefore, can be inhibited from reacting with an organic component other than the epoxy resin (D) as a constituent component of the photosensitive conductive paste. Hence, thickening can be suppressed. Reaction with an alkali component during alkali development is also suppressed so that the possibility of spillage can be reduced.

Among monohydric alcohols, the compound (E) containing a linear saturated alkyl group and the compound (E) containing a branched saturated alkyl group are preferred, and the compound (E) containing a linear saturated alkyl group is more preferred. The compound (E) containing a linear saturated alkyl group more easily moves in the photosensitive conductive paste, and hence can more likely react with an epoxy group of the epoxy resin (D). One or more kinds of the compound (E) can be used.

The compound (E) having 1 to 3 hydroxyl groups and 10 to 18 carbon atoms, which is contained in the photosensitive conductive paste, is used in an amount of preferably 1 to 100 parts by weight, more preferably 5 to 70 parts by weight based on 100 parts by weight of the photosensitive component (B). When the amount of the compound (E) is 5 parts by weight or more, adhesion can be maintained after the wet heat test, and when the amount of the compound (E) is 70 parts by weight or less, chipping and breakage of the pattern during development can be suppressed.

The photosensitive conductive paste may contain a carboxylic acid or an anhydride thereof. Specific examples of the compound having a carboxylic acid include acetic acid, propionic acid, succinic acid, maleic acid, phthalic acid, 1,2,3,6-tetrahydrophthalic acid, 3,4,5,6-tetrahydrophthalic acid, hexahydrophthalic acid, 4-methylhexahydrophthalic acid, methylbicyclo[2.2.1]heptane-2,3-dicarboxylic acid, ethylene glycol bisanhydrotrimellitate, glycerin bisanhydrotrimellitate monoacetate, tetrapropenylsuccinic acid, octenylsuccinic acid, 3,3',4,4'-diphenylsulfonetetracarboxylic acid, 1,3,3a,4,5,9b-hexahydro-5 (tetrahydro-2,5-dioxo-3-furanyl)naphtho[1,2-c]furan-1,3-dione, 1,2,3,4-butanetetracarboxylic acid, cyclohexane-1,2,3,4-tetracarboxylic acid, Floren G-700 (manufactured by KYOEISHA CHEMICAL Co., LTD.), Floren G-900 (manufactured by KYOEISHA CHEMICAL Co., LTD.), BYK-P105 (manufactured by BYK Company), BYK-P105 (manufactured by BYK Company), KD-4 (manufactured by Croda Company), KD-8 (manufactured by Croda Company), KD-9 (manufactured by Croda Company), KD-12 (manufactured by Croda Company), KD-15 (manufactured by Croda Company), JP-57 (manufactured by Croda Company) and PA-111 (manufactured by Ajinomoto Fine-Techno Co., Inc.). The acid anhydride refers to a compound in which two carboxylic acid molecules are dehydration-condensed, and specific examples include acetic anhydride, propionic anhydride, succinic anhydride, maleic anhydride, phthalic anhydride, 1,2,3,6-tetrahydrophthalic anhydride, 3,4,5,6-tetrahydrophthalic anhydride, hexahydrophthalic anhydride, 4-methylhexahydrophthalic anhydride, methylbicyclo[2.2.1]heptane-2,3-dicarboxylic anhydride, ethylene glycol bisanhydrotrimellitate, glycerin bisanhydrotrimellitate monoacetate, tetrapropenylsuccinic anhydride, octenylsuccinic anhydride, 3,3',4,4'-diphenylsulfonetetracarboxylic anhydride, 1,3,3a,4,5,9b-hexahydro-5(tetrahydro-2,5-dioxo-3-furanyl)naphtho[1,2-c]furan-1,3-dione, 1,2,3,4-butanetetracarboxylic dianhydride and cyclohexane-1,2,3,4-tetracarboxylic 3,4-anhydride.

When a carboxylic acid or an anhydride thereof is used for the photosensitive conductive paste, the added amount thereof is preferably 0.5 to 30 parts by weight, more preferably 1 to 20 parts by weight based on 100 parts by weight of the photosensitive component (B). When the added amount of a compound having the carboxylic acid or an anhydride thereof is 0.5 parts by weight or more based on 100 parts by weight of the photosensitive component (B), the affinity to development is increased and good patterning can be obtained as well as the conductivity of the final composition is enhanced. When the added amount of the acid anhydride is 30 parts by weight or less, the development margin and adhesion under a high temperature and high humidity can be improved.

The photosensitive conductive paste may contain a solvent. Examples of the solvent include N,N-dimethylacetamide, N,N-dimethylformamide, N-methyl-2-pyrrolidone, dimethyl imidazolidinone, dimethyl sulfoxide, γ-butyrolactone, ethyl lactate, 1-methoxy-2-propanol, 1-ethoxy-2-propanol, ethylene glycol mono-n-propyl ether, diacetone alcohol, tetrahydrofurfuryl alcohol, propylene glycol monomethyl ether acetate, diethylene glycol monomethyl ether, diethylene glycol monomethyl ether acetate, diethylene glycol monobutyl ether, triethylene glycol dimethyl ether and 2,2,4-trimethyl-1,3-pentanediol monoisobutyrate. A solvent having a boiling point of 150° C. or higher is preferred. When the boiling point is 150° C. or higher, splashing of the solvent is suppressed so that thickening of the photosensitive conductive paste can be inhibited. One solvent may be used, or two or more solvents may be mixed and used. The solvent may be added for adjustment of the viscosity after preparation of the paste.

The photosensitive conductive paste may contain additives such as a non-photosensitive polymer having no unsaturated double bond in the molecule, a plasticizer, a leveling agent, a surfactant, a silane coupling agent, an antifoaming agent and a pigment as long as its desired characteristics are not impaired. Specific examples of the non-photosensitive polymer include epoxy resins, novolak resins, phenol resins, polyimide precursors and ring-closed polyimides.

Specific examples of the plasticizer include dibutyl phthalate, dioctyl phthalate, polyethylene glycol and glycerin. Specific examples of the leveling agent include special vinyl-based polymers and special acryl-based polymers.

Examples of the silane coupling agent include methyltrimethoxysilane, dimethyldiethoxysilane, phenyltriethoxysilane, hexamethyldisilazane, 3-methacryloxypropyltrimethoxysilane, 3-glycidoxypropyltrimethoxysilane, vinyltrimethoxysilane and 3-glycidoxypropylmethyldiethoxysilane.

The photosensitive conductive paste is prepared using a disperser, a kneader or the like. Specific examples thereof include, but are not limited to, a three-roll roller, a ball mill and a planetary ball mill.

A method of producing a conductive pattern using the photosensitive conductive paste will now be described. To prepare a conductive pattern, the paste is applied onto a substrate and dried by heating the paste to volatilize a solvent. Thereafter, a desired pattern is formed on the substrate by passing through a development step with the paste exposed via a pattern forming mask. Then, the pattern is cured at a temperature of 100 to 300° C. to prepare a conductive pattern.

Examples of the substrate include, but are not limited to, PET films, polyimide films, polyester films, aramid films, epoxy resin substrates, polyether imide resin substrates, polyether ketone resin substrates, polysulfone-based resin substrates, glass substrates, silicon wafers, alumina substrates, aluminum nitride substrates and silicon carbide substrates.

Examples of the method of applying the photosensitive conductive paste include spin coating, spray coating, roll coating, screen printing, blade coaters, die coaters, calender coaters, meniscus coaters and bar coaters. The coating film thickness varies depending on a coating method, a solid concentration of the composition, a viscosity and the like, but the paste is normally applied such that the film thickness after drying is 0.1 to 50 µm.

Next, a solvent is removed from the coating film applied onto the substrate. Examples of the method of removing a solvent include heating/drying by an oven, a hot plate, an infrared ray or the like and vacuum drying. Preferably, heating/drying is performed at 50° C. to 180° C. for 1 minute to several hours.

The coating film after removal of the solvent is pattern-processed by a photolithography method. The light source to be used for exposure is preferably the i ray (365 nm), the h ray (405 nm) or the g ray (436 nm) of a mercury lamp.

After exposure, a desired pattern is obtained by removing an unexposed part using a developer. As a developer to be used for alkali development, an aqueous solution of a compound such as tetramethylammonium hydroxide, diethanolamine, diethylaminoethanol, sodium hydroxide, potassium hydroxide, sodium carbonate, potassium carbonate, triethylamine, diethylamine, methylamine, dimethylamine, dimethylaminoethyl acetate, dimethylaminoethanol, dimethylaminoethyl methacrylate, cyclohexylamine, ethylenediamine, hexamethylenediamine or the like is preferred. In some cases, a liquid obtained by adding to the aforementioned aqueous solution one or more of polar solvents such as N-methyl-2-pyrrolidone, N,N-dimethylformamide, N,N-dimethylacetamide, dimethyl sulfoxide and γ-butyrolactone, alcohols such as methanol, ethanol and isopropanol, esters such as ethyl acetate and propylene glycol monomethyl ether acetate, and ketones such as cyclopentanone, cyclohexanone, isobutyl ketone and methyl isobutyl ketone may be used as a developer. A liquid obtained by adding a surfactant to the above-mentioned aqueous alkali solution may also be used as a developer. As a developer to be used for organic development, a polar solvent such as N-methyl-2-pyrrolidone, N-acetyl-2-pyrrolidone, N,N-dimethylacetamide, N,N-dimethylformamide, dimethyl sulfoxide or hexamethylphosphortriamide alone, or a mixed solution with the polar solvent combined with methanol, ethanol, isopropyl alcohol, xylene, water, methyl carbitol, ethyl carbitol or the like may be used.

Development can be performed by a method in which the developer is sprayed to a coating film surface while a substrate is left at rest or rotated, or a substrate is immersed in a developer, or a substrate is immersed while an ultrasonic wave is applied thereto.

After development, a rinsing treatment with water may be performed. The rinsing treatment may be performed with an alcohol such as ethanol or isopropyl alcohol or an ester such as ethyl acetate or propylene glycol monomethyl ether acetate added to water.

Next, the paste composition film is cured to exhibit conductivity. Examples of the method for curing the paste composition film include heating/drying by an oven, an inert oven, a hot plate, an infrared ray or the like and vacuum drying. The curing temperature is preferably 100 to 300° C., more preferably 120 to 180° C. When the heating temperature is 120° C. or higher, the volume shrinkage amount of a resin can be increased, leading to a decrease in specific resistivity. The photosensitive conductive paste can be used on a substrate having low heat resistance, or used in combination with a material having low heat resistance because high conductivity can be obtained by curing at a relatively low temperature of 180° C. or lower. In this way, a conductive pattern can be prepared by passing through a curing step.

EXAMPLES

Examples will be described below, but this disclosure is not limited to these examples. Materials and evaluation methods used in examples and comparative examples are as follows.

Method of Evaluating Patterning Characteristics

A photosensitive conductive paste was applied onto a PET film so as to have a dry thickness of 10 µm, dried in a drying oven at 90° C. for 10 minutes, exposed via a photomask having nine units having different L/S values, one unit including a group of lines arranged with a fixed line-and-space (L/S), developed and cured at 140° C. for 1 hour to obtain a conductive pattern. The L/S values of the units were set to 50/50, 40/40, 30/30, 25/25 and 20/20 (each showing a line width (µm)/interval (µm)). The pattern was observed with an optical microscope to confirm a pattern which was free from residues between patterns and free from pattern peeling and had the smallest L/S value, and the smallest L/S value was defined as a development-enabling L/S.

Method for Specific Resistivity

A photosensitive conductive paste was applied onto a PET film to have a dry thickness of 10 µm, dried in a drying oven at 90° C. for 10 minutes, exposed via a photomask having a light transmission part A with a pattern shown in FIG. 1, developed and cured in a drying oven at 140° C. for 1 hour to obtain a specific resistivity measuring conductive pattern. The conductive pattern has a line width of 0.400 mm and a line length of 80 mm. Ends of the obtained pattern were connected through a surface resistance meter to measure a surface resistance value, and a specific resistivity was calculated by fitting the measured value in the calculation formula described below. The film thickness was measured using a probe type step profiler "SURFCOM 1400" (trade name, manufactured by TOKYO SEIMITSU CO., LTD.). The film thickness was measured at randomly selected ten positions, and an average value of the thicknesses at ten positions was defined as a film thickness. The wavelength was 1 mm, and the scanning speed was 0.3 mm/s. For the line width, an average value of line widths at ten positions obtained by observing the pattern at randomly selected ten positions with an optical microscope and analyzing the image data was defined as a line width.

Specific resistivity=surface resistance value×thickness× line width/line length.

In Examples 7 to 14 and Comparative Example 3 to 6, the specific resistivity was measured for 100 samples, and a case where the specific resistivity was less than 1E-4 Ωcm for 90 or more samples was considered good, and rated "○" for pattern processability. When pattern processability was "○", an average specific resistivity for 100 samples was determined.

Storage Stability of Paste Coating Film

Ten samples obtained by applying a photosensitive conductive paste onto a PET film to have a dry thickness of 10 μm and drying the paste in a drying oven at 90° C. for 10 minutes was provided. At each of the time points immediately after drying and 1 day, 2 days, 3 days, 4 days, 5 days, 6 days, 7 days, 8 days and 9 days after drying, one sample was shower-developed for 40 seconds with a developer (0.2% aqueous sodium carbonate solution) at an exposure amount of 200 mJ via a photomask having a L/S value of 40/40 (each showing a line width (μm)/interval (μm)), then washed with pure water, and then dried by air blowing. Then, the sample was cured at 140° C. for 1 hour to obtain a conductive pattern. The day when the line width became equal to or greater than 1.1 times as large as the line width of the conductive pattern obtained by exposing, developing and curing the sample immediately after drying for the first time was defined as a number of storage stability days. A case where the number of storage stability days was 3 or more was considered good. Storage was conducted in a clean room at 23° C.

Evaluation of Adhesion

A photosensitive conductive paste was applied onto a PET film to have a dry thickness of 10 μm, dried in a drying oven at 90° C. for 10 minutes, exposed over the entire surface, developed and cured at 140° C. for 1 hour. Adhesion was evaluated in accordance with JIS Standard K5600-5-6 (1999) (ISO 2409: 1992), and a case where peeling did not occur at 100 cleavages was rated "○".

Method for Evaluation of Adhesion with ITO

A photosensitive conductive paste was applied onto a PET film with ITO "ELECRYSTA" (registered trademark) V270L-TFS (manufactured by NITTO DENKO CORPORATION) to have a dry thickness of 7 μm, dried in a drying oven at 90° C. for 10 minutes, exposed over the entire printing surface, and then cured in a drying oven at 140° C. for 1 hour, a cut was then made in the form of 10×10 squares with a width of 1 mm, and the sample was placed in a thermo-hygrostat bath SH-661 (manufactured by ESPEC Corp.) at 85° C. and 85% RH for 240 hours. Thereafter, the sample was taken out, a tape was attached at the location of the squares and peeled off, and assessment was performed with a number of remaining squares. A cellophane tape (manufactured by NICHIBAN CO., LTD.) was used as the tape. A case where 95 or more squares remained was rated "○".

Materials used in the examples and comparative examples are as follows.

Conductive Particles (A)

Particles having the materials and average particle sizes described in Tables 1 and 2 were used. The average particle size was determined by the following method.

Measurement of Volume Average Particle Size

The volume average particle size of the conductive particles (A) was measured using a dynamic light scattering particle size distribution meter manufactured by HORIBA, Ltd.

Photosensitive Component (B)

Synthesis Example 1

Photosensitive Component (B-1)

Photosensitive component obtained by addition reaction of 5 parts by weight of glycidyl methacrylate (GMA) with a copolymer of ethyl acrylate (EA)/2-ethylhexyl methacrylate (2-EHMA)/styrene (st)/acrylic acid (AA) (copolymerization ratio: 20 parts by weight/40 parts by weight/20 parts by weight/15 parts by weight).

Diethylene glycol monoethyl ether acetate (150 g) was added in a reaction vessel in a nitrogen atmosphere, and the temperature was elevated to 80° C. using an oil bath. To this was added dropwise for 1 hour a mixture including ethyl acrylate (20 g), 2-ethylhexyl methacrylate (40 g), styrene (20 g), acrylic acid (15 g), 2,2'-azobisisobutyronitrile (0.8 g) and diethylene glycol monoethyl ether acetate (10 g). After completion of the dropwise addition, further a polymerization reaction was carried out for 6 hours. Thereafter, hydroquinone monomethyl ether (1 g) was added to stop the polymerization reaction. Subsequently, a mixture including glycidyl methacrylate (5 g), triethyl benzyl ammonium chloride (1 g) and diethylene glycol monoethyl ether acetate (10 g) was added dropwise for 0.5 hours. After completion of the dropwise addition, further an addition reaction was carried out for 2 hours. The obtained reaction solution was refined with methanol to remove unreacted impurities, and dried under vacuum for 24 hours to obtain a photosensitive component (B-1). The obtained photosensitive component B-1 had an acid value of 103 mg KOH/g and a glass transition temperature of 21.7° C. as determined from the formula (1).

Synthesis Example 2

Photosensitive Component (B-2)

Photosensitive component obtained by addition reaction of 5 parts by weight of glycidyl methacrylate (GMA) with a copolymer of ethylene oxide-modified bisphenol A diacrylate FA-324A (product name, manufactured by Hitachi Chemical Co., Ltd.)/EA/AA (copolymerization ratio: 50 parts by weight/10 parts by weight/15 parts by weight).

Diethylene glycol monoethyl ether acetate (150 g) was added in a reaction vessel in a nitrogen atmosphere, and the temperature was elevated to 80° C. using an oil bath. To this was added dropwise for 1 hour a mixture including ethylene oxide-modified bisphenol A diacrylate FA-324A (50 g), ethyl acrylate (20 g), acrylic acid (15 g), 2,2'-azobisisobutyronitrile (0.8 g) and diethylene glycol monoethyl ether acetate (10 g). After completion of the dropwise addition, further a polymerization reaction was carried out for 6 hours. Thereafter, hydroquinone monomethyl ether (1 g) was added to stop the polymerization reaction. Subsequently, a mixture including glycidyl methacrylate (5 g), triethyl benzyl ammonium chloride (1 g) and diethylene glycol monoethyl ether acetate (10 g) was added dropwise for 0.5 hours. After completion of the dropwise addition, further an addition reaction was carried out for 2 hours. The obtained reaction solution was refined with methanol to remove unreacted impurities, and dried under vacuum for 24 hours to obtain a photosensitive component B-2. The obtained photosensitive component (B-2) had an acid value of 96 mg KOH/g and a glass transition temperature of 19.9° C. as determined from formula (1).

Photopolymerization Initiator (C)

IRGACURE 369 (trade name, manufactured by Ciba Japan K.K.)

Epoxy Resin (D)

Epoxy resin (D-1): JER 828 (epoxy equivalent: 188) manufactured by Mitsubishi Chemical Corporation
Epoxy resin (D-2): ADEKA RESIN EPR-21 (epoxy equivalent: 210) manufactured by ADEKA CORPORATION
Epoxy resin (D-3): ADEKA RESIN EPR-4030 (epoxy equivalent: 380) manufactured by ADEKA CORPORATION
Epoxy resin (D-4): JER 1001 (epoxy equivalent: 475) manufactured by Mitsubishi Chemical Corporation
Epoxy resin (D-5): JER 1002 (epoxy equivalent: 650) manufactured by Mitsubishi Chemical Corporation
Epoxy resin (D-6): EOCN-103s (epoxy equivalent: 210) manufactured by Nippon Kayaku Co., Ltd.
Compound (E-1) 1-dodecanol (manufactured by Tokyo Chemical Industry Co., Ltd., linear saturated monohydric alcohol, carbon number: 12)
Compound (E-2) 1-tetradecanol (manufactured by Tokyo Chemical Industry Co., Ltd., linear saturated monohydric alcohol, carbon number: 14)
Compound (E-3) 1-octadecanol (manufactured by Tokyo Chemical Industry Co., Ltd., linear saturated monohydric alcohol, carbon number: 18)
Compound (E-4) 3,7-dimethyl-1-octanol (manufactured by Tokyo Chemical Industry Co., Ltd., branched saturated monohydric alcohol, carbon number: 14)
Leveling agent: L1980 (manufactured by Kusumoto Chemicals, Ltd.)
Monomer: Light Acrylate BP-4EA (manufactured by KYOEISHA CHEMICAL Co., LTD.)
Solvent: diethylene glycol monobutyl ether (manufactured by Tokyo Chemical Industry Co., Ltd.)

Example 1

A photosensitive component (B) (17.5 g), a photopolymerization initiator (C) IRGACURE 369 (manufactured by Ciba Japan K.K.) (3.5 g), diethylene glycol monobutyl ether (17.0 g) and an epoxy resin (D) were added, and mixed by "Awatori Rentaro" (trade name, ARE-310, manufactured by THINKY CORPORATION) to obtain a photosensitive resin solution (38.0 g) (solid content: 55.3% by weight).

The obtained photosensitive resin solution (38.0 g) and Ag particles having an average particle size of 2 μm (140.5 g) were mixed together, and the mixture was kneaded using a three-roll roller "EXAKT M-50" (trade name, manufactured by EXAKT Company) to obtain a photosensitive conductive paste (178.5 g).

The obtained paste was applied onto a PET film having a film thickness of 100 μm by screen printing, and dried in a drying oven at 90° C. for 10 minutes. Thereafter, the paste was exposed over the entire line at an exposure amount of 300 mJ/cm$^2$ (in terms of a wavelength of 365 nm) using exposure equipment "PEM-6M" (trade name, manufactured by UNION OPTICAL CO., LTD.), subjected to immersion development with a 0.25% $Na_2CO_3$ solution for 50 seconds, and rinsed with ultrapure water, and then cured in a drying oven at 140° C. for 1 hour. The pattern-processed conductive pattern had a film thickness of 10 μm The line-and-space (L/S) pattern of the conductive pattern was observed with an optical microscope to confirm that the conductive pattern was satisfactorily pattern-processed with no residue between patterns and no pattern peeling when the L/S was 20/20 μm or less. The specific resistivity of the conductive pattern was measured to be 8.1×10$^{-5}$ Ωcm. The number of storage stability days was 3, showing a good result. The conductive pattern was rated "◯" for adhesion because peeling did not occur.

Examples 2 to 6

A photosensitive conductive paste with the composition shown in Table 1 was produced in the same manner as in Example 1, and evaluated in the same manner as in Example 1. The evaluation results are shown in Table 1.

Examples 8 to 14

A photosensitive conductive paste with the composition shown in Table 2 was produced in the same manner as in Example 7, and evaluated in the same manner as in Example 1. The evaluation results are shown in Table 2.

Comparative Examples 1 to 2

A photosensitive conductive paste with the composition shown in Table 1 was produced in the same manner as in Example 1, and evaluated in the same manner as in Example 1. The evaluation results are shown in Table 1.

TABLE 1

| | | Photopolymerization initiator (C) | | Conductive particles (A) | | | Epoxy resin (D) | |
|---|---|---|---|---|---|---|---|---|
| | Photosensitive component (B) Type | Type | Added amount (parts by weight) based on 100 parts by weight of photosensitive component (B) | Content in paste (% by weight) | Type | Average particle size (μm) | Type | Added amount (parts by weight) based on 100 parts by weight of photosensitive component (B) |
| Example 1 | B-1 | IRGACURE 369 | 20 | 87 | Ag | 2.0 | D-2 | 50 |
| Example 2 | B-1 | IRGACURE 369 | 20 | 87 | Ag | 2.0 | D-3 | 50 |
| Example 3 | B-1 | IRGACURE 369 | 20 | 87 | Ag | 2.0 | D-4 | 50 |

TABLE 1-continued

| | | | | | | | | |
|---|---|---|---|---|---|---|---|---|
| Example 4 | B-2 | IRGACURE 369 | 20 | 87 | Ag | 2.0 | D-2 | 50 |
| Example 5 | B-2 | IRGACURE 369 | 20 | 87 | Ag | 2.0 | D-3 | 50 |
| Example 6 | B-2 | IRGACURE 369 | 20 | 87 | Ag | 2.0 | D-4 | 50 |
| Comparative Example 1 | B-2 | IRGACURE 369 | 20 | 87 | Ag | 2.0 | D-1 | 50 |
| Comparative Example 2 | B-2 | IRGACURE 369 | 20 | 87 | Ag | 2.0 | D-5 | 50 |

| | Characteristics of conductive pattern | | | | |
|---|---|---|---|---|---|
| | Development-enabling L/S (μm) | Specific resistivity (Ωcm) | Pattern process-ability | Number of storage stability days (days) | Adhesion |
| Example 1 | 20/20 | $9.5 \times 10^{-5}$ | ○ | 3 days | ○ |
| Example 2 | 20/20 | $9.1 \times 10^{-5}$ | ○ | 3 days | ○ |
| Example 3 | 20/20 | $8.8 \times 10^{-5}$ | ○ | 3 days | ○ |
| Example 4 | 20/20 | $1.0 \times 10^{-4}$ | ○ | 3 days | ○ |
| Example 5 | 20/20 | $9.8 \times 10^{-5}$ | ○ | 3 days | ○ |
| Example 6 | 20/20 | $9.2 \times 10^{-4}$ | ○ | 3 days | ○ |
| Comparative Example 1 | 20/20 | $5.5 \times 10^{-4}$ | ○ | 1 day | x |
| Comparative Example 2 | 20/20 | $9.2 \times 10^{-5}$ | ○ | 4 day | x |

In Examples 1 to 6, both storage stability and adhesion of the paste coating film were good so that a pattern having a high resolution could be formed, and a conductive pattern could be obtained by curing at 140° C. However, in Comparative examples 1 and 2, both storage stability and adhesion of the paste coating film was poor.

Example 7

A photosensitive component (B-1) (17.5 g), a photopolymerization initiator (C) IRGACURE 369 (manufactured by Ciba Japan K.K.) (3.5 g), an epoxy resin (D) (1.5 g), Light Acrylate BP-4EA (manufactured by KYOEISHA CHEMICAL Co., LTD.) (3.5 g), a compound (E) (2.5 g) and diethylene glycol monobutyl ether (17.0 g) were added, and mixed by "Awatori Rentaro" (trade name, ARE-310, manufactured by THINKY CORPORATION) to obtain a photosensitive resin solution (45.5 g) (solid content: 62.6% by weight).

The obtained photosensitive resin solution (45.5 g) and Ag particles having an average particle size of 1 μm (129.8 g) were mixed together, and the mixture was kneaded using a three-roll roller "EXAKT M-50" (trade name, manufactured by EXAKT Company) to obtain a photosensitive conductive paste (175.3 g).

The obtained paste was applied onto a PET film having a film thickness of 100 μm by screen printing, and dried in a drying oven at 90° C. for 10 minutes. Thereafter, the paste was exposed over the entire line at an exposure amount of 200 mJ/cm² (in terms of a wavelength of 365 nm) using exposure equipment "PEM-6M" (trade name, manufactured by UNION OPTICAL CO., LTD.), subjected to immersion development with a 0.25% $Na_2CO_3$ solution for 50 seconds, and rinsed with ultrapure water, and then cured in a drying oven at 140° C. for 1 hour. The pattern-processed conductive pattern had a film thickness of 10 μm. The line-and-space (L/S) pattern of the conductive pattern was observed with an optical microscope to confirm that the conductive pattern was satisfactorily pattern-processed with no residue between patterns and no pattern peeling when the L/S was 15/15 μm or less. The average specific resistivity for 100 conductive patterns was measured to be $7.8 \times 10^{-5}$ Ωcm. The number of remaining squares in the test of adhesion with an ITO film was 98, and evaluated as "○".

Examples 8 to 14

A photosensitive conductive paste with the composition shown in Table 2 was produced in the same manner as in Example 7, and evaluated in the same manner as in Example 7. The evaluation results are shown in Table 2.

TABLE 2

| | Photo-sensitive component (B) Type | Photopolymerization initiator (C) | | Conductive particles (A) | | | Epoxy resin (D) | |
|---|---|---|---|---|---|---|---|---|
| | | Type | Added amount (parts by weight) based on 100 parts by weight of photosensitive component (B) | Content in paste (% by weight) | Average particle size (μm) | Type | Type | Added amount (parts by weight) based on 100 parts by weight of photosensitive component (B) |
| Example 7 | B-1 | IRGACURE 369 | 20 | 82 | | 1.0 | Ag | D-6 | 9 |
| Example 8 | B-1 | IRGACURE 369 | 20 | 82 | | 1.0 | Ag | D-6 | 9 |

TABLE 2-continued

| | | | | | | | | | |
|---|---|---|---|---|---|---|---|---|---|
| Example 9 | B-1 | IRGACURE 369 | 20 | 82 | Ag | 1.0 | D-6 | 9 |
| Example 10 | B-1 | IRGACURE 369 | 20 | 82 | Ag | 1.0 | D-6 | 9 |
| Example 11 | B-2 | IRGACURE 369 | 20 | 82 | Ag | 1.0 | D-6 | 9 |
| Example 12 | B-2 | IRGACURE 369 | 20 | 82 | Ag | 1.0 | D-6 | 9 |
| Example 13 | B-2 | IRGACURE 369 | 20 | 82 | Ag | 1.0 | D-6 | 9 |
| Example 14 | B-2 | IRGACURE 369 | 20 | 82 | Ag | 1.0 | D-6 | 9 |

| | Compound (E) | | Characteristics of conductive pattern | | | Adhesion | |
|---|---|---|---|---|---|---|---|
| | Type | Added amount (parts by weight) based on 100 parts by weight of photosensitive component (B) | Development-enabling L/S (μm) | Specific resistivity (Ωcm) | Pattern processability | Number of remaining squares | Evaluation |
| Example 7 | E-1 | 14 | 15/15 | $7.8 \times 10^{-5}$ | ○ | 98 | ○ |
| Example 8 | E-2 | 14 | 15/15 | $7.6 \times 10^{-5}$ | ○ | 100 | ○ |
| Example 9 | E-3 | 14 | 15/15 | $7.9 \times 10^{-5}$ | ○ | 99 | ○ |
| Example 10 | E-4 | 14 | 15/15 | $8.1 \times 10^{-5}$ | ○ | 96 | ○ |
| Example 11 | E-1 | 14 | 15/15 | $8.5 \times 10^{-5}$ | ○ | 97 | ○ |
| Example 12 | E-2 | 14 | 15/15 | $7.8 \times 10^{-5}$ | ○ | 99 | ○ |
| Example 13 | E-3 | 14 | 15/15 | $8.1 \times 10^{-5}$ | ○ | 99 | ○ |
| Example 14 | E-4 | 14 | 15/15 | $7.6 \times 10^{-5}$ | ○ | 96 | ○ |

In Examples 7 to 14, adhesion after the wet heat test was good so that a pattern having a high resolution could be formed, and a conductive pattern could be obtained by curing at 140° C.

The invention claimed is:

1. A photosensitive conductive paste comprising: conductive particles (A); a photosensitive component (B); a photopolymerization initiator (C); an epoxy resin (D); and a compound (E) having 1 to 3 hydroxyl groups and 10 to 18 carbon atoms, wherein the epoxy resin (D) has an epoxy equivalent weight of 200 to 500 g/equivalent, and the photosensitive component (B) has an unsaturated double bond and an acid value of 40 to 200 KOH/g.

2. The photosensitive conductive paste according to claim 1, wherein the volume average particle size of the conductive particles (A) is 0.3 to 3 μm.

3. A method of producing a conductive pattern, wherein the photosensitive conductive paste according to claim 1 is applied onto a substrate, exposed to a light source in a desired pattern, removing unexposed portions with a developer, and then cured at a temperature of 100 to 300° C.

4. A photosensitive conductive paste comprising: 70 to 95% by weight of conductive particle (A) based on the total solid content in the photosensitive conductive paste; a photosensitive component (B); a photopolymerization initiator (C); and an epoxy resin (D), wherein the epoxy resin (D) has an epoxy equivalent weight of 200 to 500 g/equivalent, and the photosensitive component (B) has an unsaturated double bond and an acid value of 40 to 200 KOH/g.

* * * * *